(12) United States Patent
Yin

(10) Patent No.: US 7,699,692 B2
(45) Date of Patent: Apr. 20, 2010

(54) FAN ASSEMBLY

(75) Inventor: Xiu-Zhong Yin, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 218 days.

(21) Appl. No.: 11/738,525

(22) Filed: Apr. 23, 2007

(65) Prior Publication Data

US 2008/0158813 A1    Jul. 3, 2008

(30) Foreign Application Priority Data

Dec. 27, 2006   (CN)   .................... 2006 2 0016781 U

(51) Int. Cl.
*H05K 5/00* (2006.01)
*H05K 7/00* (2006.01)
*H01R 13/64* (2006.01)

(52) U.S. Cl. ........................ 454/184; 361/687; 439/247

(58) Field of Classification Search ................ 454/184; 361/695; 439/894
See application file for complete search history.

(56) References Cited

U.S. PATENT DOCUMENTS

| 5,788,566 | A | * | 8/1998 | McAnally et al. ............ 454/184 |
| 6,213,819 | B1 | * | 4/2001 | Fan ............................. 439/894 |
| 6,808,411 | B2 | | 10/2004 | Chen |
| 2004/0256334 | A1 | | 12/2004 | Chen |

* cited by examiner

*Primary Examiner*—Steve McAllister
*Assistant Examiner*—Helena Kosanovoc
(74) *Attorney, Agent, or Firm*—Frank R. Niranjan

(57) ABSTRACT

A fan assembly (20) for dissipating heat from an electronic device includes a bracket (30) and a fan module (40). The bracket has a retaining wall (31). The retaining wall defines an opening (311) and two vertical slots (313) at opposite sides of the opening. The fan module includes a fan (50) and a pair of clamp members (60). The fan has a fan opening corresponding to the opening of the bracket. The clamp members are respectively attached to opposite sides of the fan. An engaging portion (62) is formed on one end of each clamp member for engaging with the corresponding slot of the bracket. Each engaging portion has a wide portion (624) configured for abutting against an outer surface of one retaining walls and a narrow portion (622) for entering to the corresponding slot.

3 Claims, 3 Drawing Sheets

FAN ASSEMBLY

BACKGROUND OF THE INVENTION

1. Field of the Invention

The present invention relates to a fan assembly, and more particularly to a fan assembly within a server enclosure for dissipating heat from electronic devices

2. Description of Related Art

In the computer industry, a computer system, such as a server, is often configured to facilitate reliable and continuous operation. Computer systems typically have multiple power supplies and fans, and each device is usually screwed to a chassis of the server. If one of these components fails or malfunctions, the component may affect continuing operation of the system until a service technician can subsequently replace the failed component. Unfortunately, some systems do not provide hot-plug components, which enable a service technician to replace the failed component during operation of the system. Thus, replacing the failed component requires shutting down the system and removing screws from the component. As a result, the replacement of the failed component can create downtime.

Further, some fixtures are used for latching the fans, such as a fan rack as presented in US patent application 20040256334. A modularized fan rack is installed in a reserved space of electronic equipment for mounting several fans, which comprises a base board, having a hollow installing section with a plurality of fixtures disposed respectively on two corresponding sides. The distance between any two adjacent fixtures substantially equal to the length of the fan being mounted onto the base board. A ventilation board with a plurality of openings for ventilating air therethrough, is disposed on the surface of one end of the base board. Two side boards are respectively disposed on both ends of the ventilation board adjacent to the base board and on the side away from the base board. The same fan being coupled by any two adjacent fixtures and another fixture being disposed adjacent to the fixture for mounting a fan adjacent to the side boards. This fan rack has a lot of components for co-retaining the fans, and assembling the fans to the base board is time-consuming.

What is needed, therefore, is to provide a fan assembly, which has a simple structure, and is easy to maintain.

SUMMARY OF THE INVENTION

A fan assembly for dissipating heat from an electronic device includes a bracket and a fan module. The bracket has a retaining wall. The retaining wall defines an opening and two vertical slots at opposite sides of the opening. The fan module includes a fan and a pair of clamp members. The fan has a fan opening corresponding to the opening of the bracket. The clamp members are respectively attached to opposite sides of the fan. An engaging portion is formed on one end of each clamp member for engaging with the corresponding slot of the bracket. Each engaging portion has a wide portion configured for abutting against an outer surface of one retaining walls and a narrow portion for entering to the corresponding slot. Each engaging portion can be directed into the slot from up to down with the narrow portion received in the slot, and the wide portion abutting against an outer surface of the retaining wall thereby the fan module perpendicularly attached to the retaining wall.

Other advantages and novel features of the present invention will become more apparent from the following detailed description of a preferred embodiment when taken in conjunction with the accompanying drawings, in which:

DETAILED DESCRIPTION OF THE INVENTION

Figure 1:
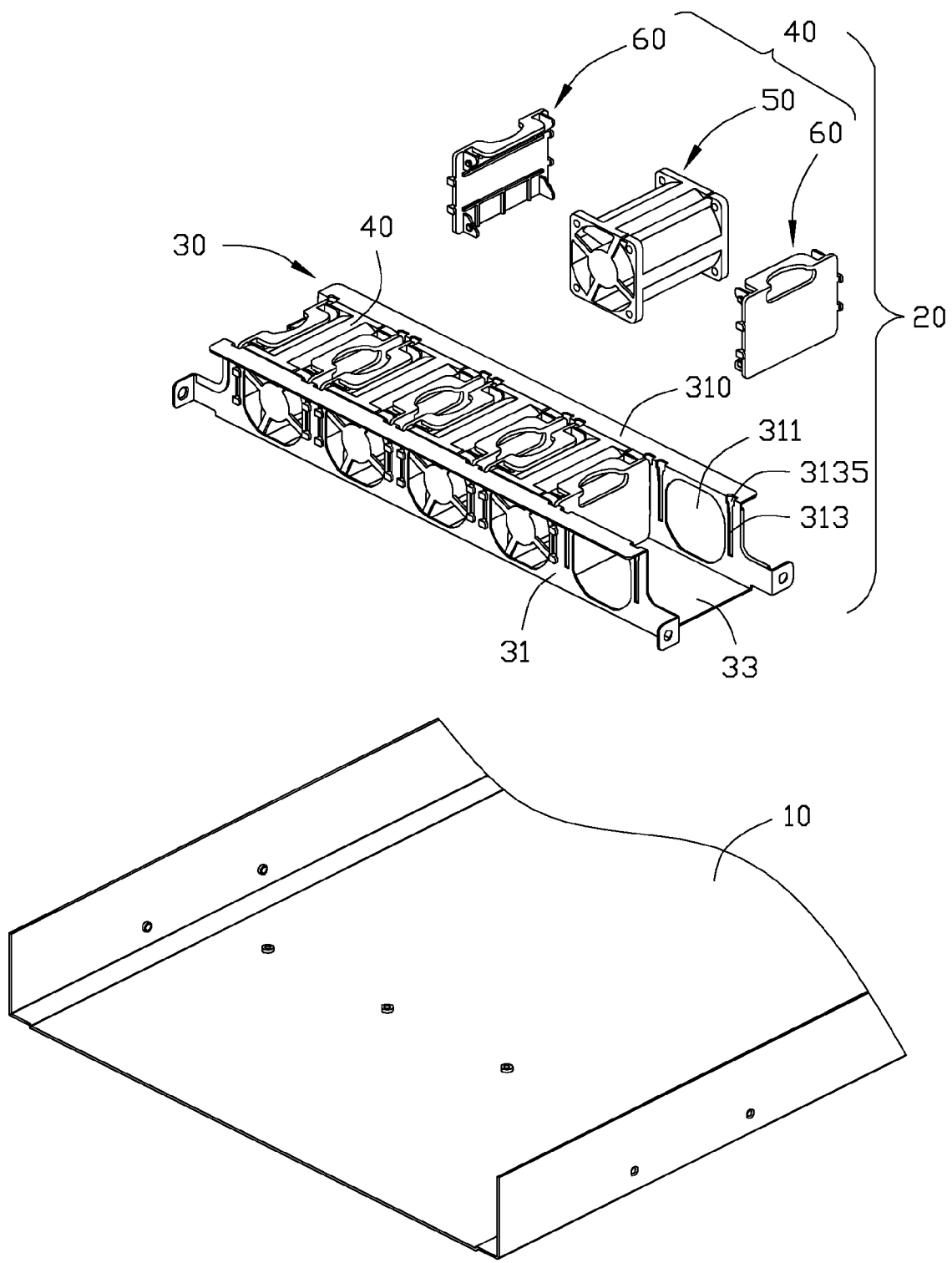
FIG. 1 is a partially exploded, isometric view of a fan assembly according to a preferred embodiment of the present invention, the fan assembly can be secured within a chassis which is partially shown, the fan assembly including a fan bracket and a plurality of fan modules.

Referring to FIG. 1, a fan assembly 20 of a preferred embodiment of the present invention can be placed within a chassis 10 for dissipating heat from an electronic device (not shown). The fan assembly 20 includes a fan bracket 30, and a plurality of fan modules 40.

The fan bracket 30 has a rectangular bottom wall 33, and a pair of retaining walls 31 perpendicularly extending up from opposite sides of the bottom wall 33. The fan bracket 30 is configured for a U-shaped corridor for receiving the fan modules 40. Each retaining wall 31 defines a plurality of pairs of aligned blow openings 311. Two slots 313 are respectively defined on opposite sides of each blow opening 311 in each retaining wall 31. The slots 313 are perpendicular to the bottom wall 33. A flange 310 extends out from a top edge of each retaining wall 31. An enlarged guiding portion 3135 is defined where a top end of each slot 313 meets the corresponding flange 310.

Figure 2:
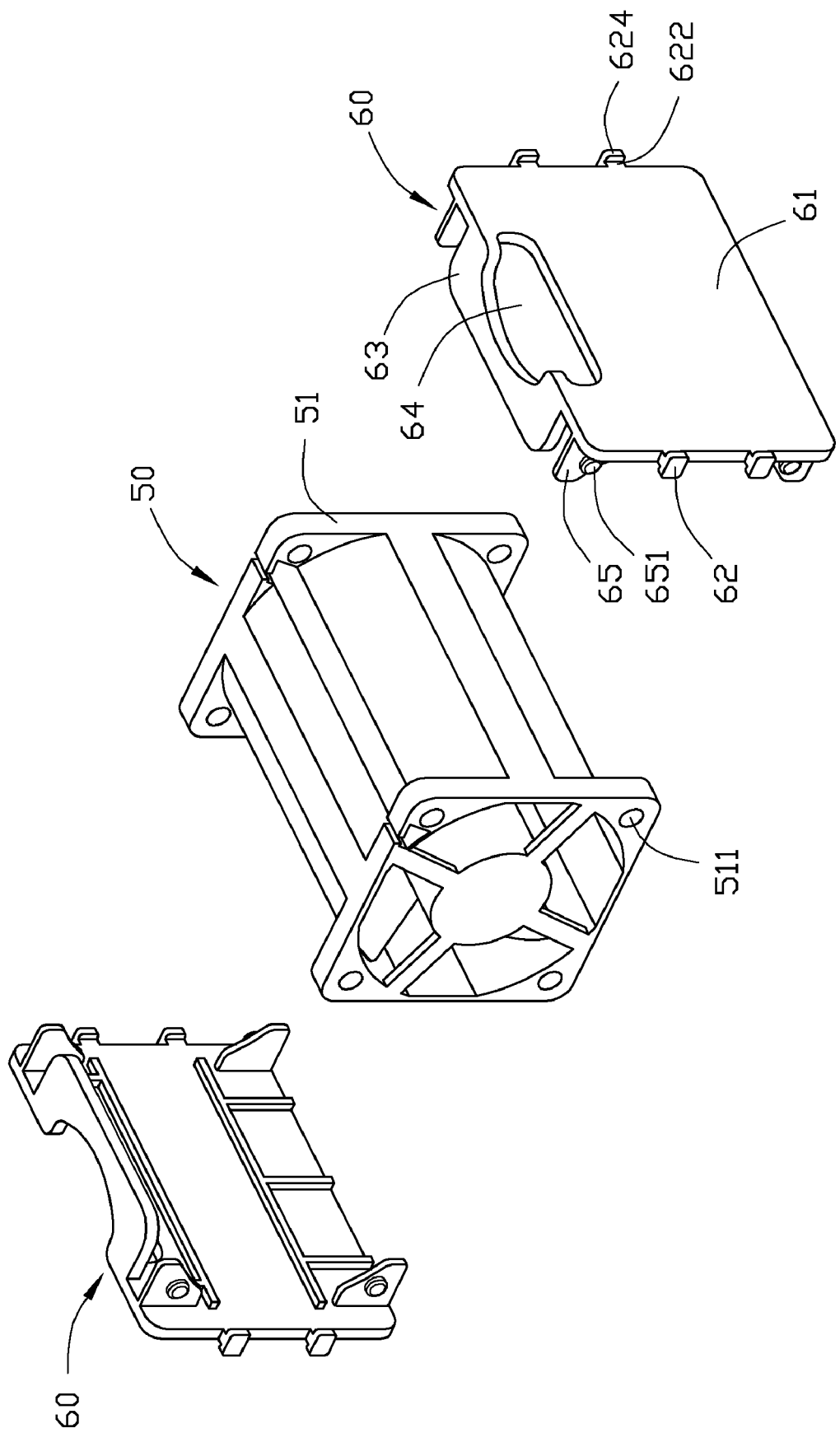
FIG. 2 is an enlarged, exploded view of a fan module of FIG. 1.

Referring also to FIG. 2, each fan module 40 includes a fan 50 and a pair of clamp members 60. The fan 50 is configured for a cubic shape. The fan 50 has two opposite rectangular side walls 51 each defining a fan opening corresponding to one of the blow opening 311 of the fan bracket 30. Each side wall 51 defines a locking hole 511 at each corner thereof. Each clamp member 60 has a rectangular base wall 61. An operating portion 63 extends horizontally from a top edge of the base wall 61. The operating portion 63 and the base wall 61 cooperatively define a finger opening 64 therein. Two pairs of elastic ears 65 are formed on the base wall 61. A post 651 is formed on each ear 65 corresponding to one of the locking holes 511. The base wall 61 has two opposite side edges. Two T-shaped engaging portions 62 extend out from each side edge of the base wall 61. Each engaging portion 62 has a narrow portion 622 and a wide portion 624. A width of the wide portion 624 is greater than a width of the slot 313 but smaller than that of the enlarged guiding portion 3135.

Figure 3:
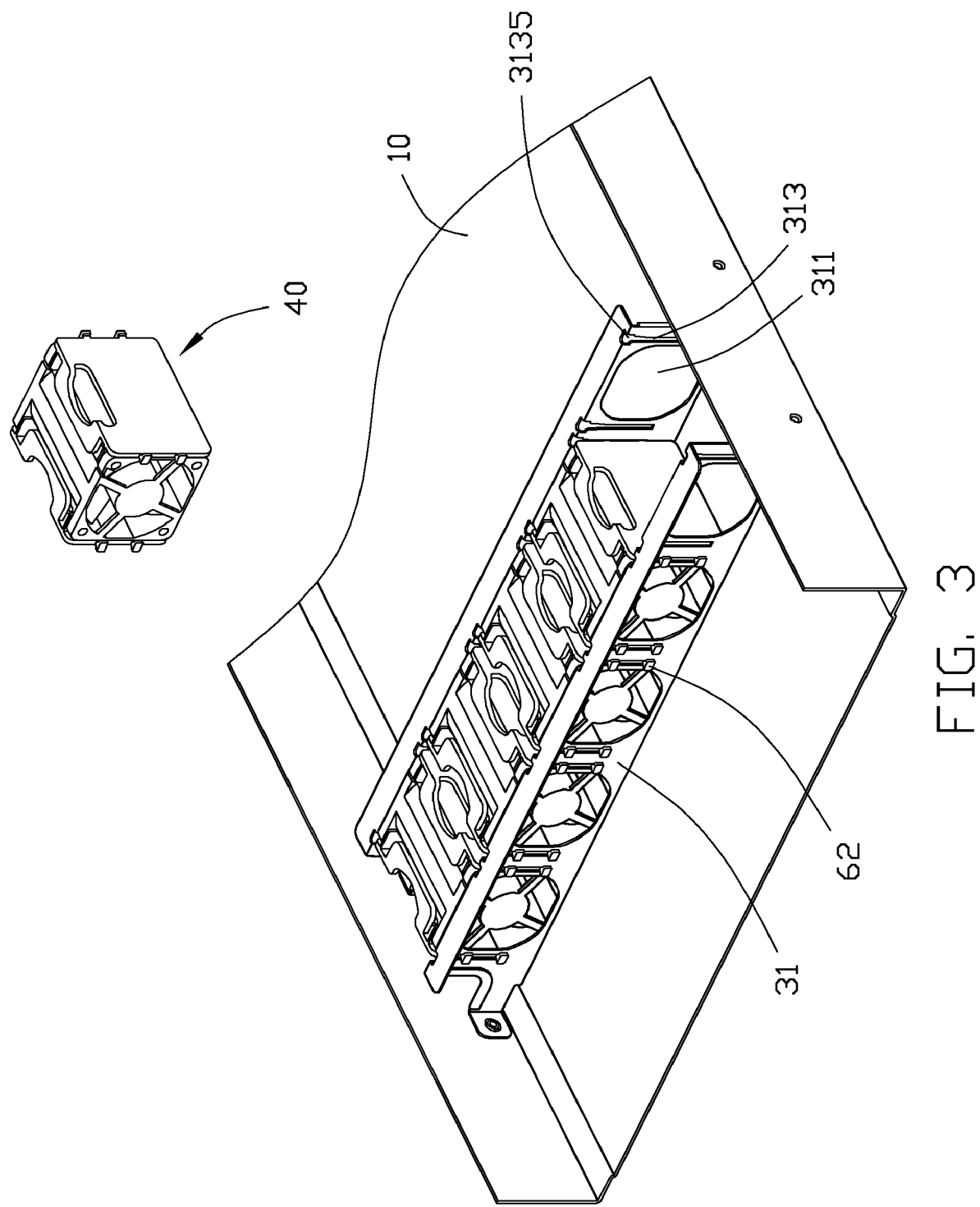
FIG. 3 is an assembled view of FIG. 1.

Referring also to FIG. 3, when assembling the fan assembly 20, the fan bracket 30 is positioned in the chassis 10. Then for each of a desired number of the fan modules 40 two clamp members 60 are attached to the fan 50 via the posts 651 being correspondingly inserted into the locking holes 511 of the fan 50. The desired number of the fan modules 40 is then be positioned in a vertical direction. The narrow portion 622 of each engaging portion 62 are respectively slid into the corresponding slot 313 of the retaining wall 31 with the wider portion 624 entering through the enlarged guiding portion 3135 to abut against the outer surface of the retaining wall 31 of the bracket 30, thus the fan module 40 is securely mounted to the fan bracket 30, and the steps are repeated for the remaining fan modules 40. When replacing one of the fan modules 40, the module 40 can be lifted up by dragging the operating portion 63 of each clamp member 60.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan assembly for dissipating heat from an electronic device which comprises a chassis, the fan assembly comprising:

a bracket fixed within the chassis, the bracket comprising a pair of parallel retaining walls cooperatively defining a plurality of pairs of aligned openings, one slot being defined at one side of each of the openings; and a plurality of fan modules arranged between the retaining walls in a longitudinal direction of the retaining walls, each of the fan modules comprising a fan sandwiched between the retaining walls and aligned with one corresponding pair of aligned openings, and a clamp member secured to one side of the fan perpendicular to the retaining walls, an engaging portion being formed at each one of opposite side edges of the clamp member and comprising a narrow portion and a wide portion, the narrow portion being capable of sliding into a corresponding one of the slots with the wide portion abutting against an outer surface of one of the retaining walls opposing the fan;

wherein the clamp member comprises a rectangular base wall and an operating portion extending from one side of the base wall, and the engaging portions are formed at opposite sides of the base wall; a tab is perpendicularly formed at each corner of the base wall, a post extends perpendicularly from each tab, the fan comprises a pair of opposite side walls each defining a plurality of holes, and the tabs are located between the side walls of the fan and are capable of being deformed to allow the posts to insert into the corresponding plurality of holes of the fan.

2. The fan assembly as claimed in claim 1, wherein each of the retaining walls further defines another slot at an opposite side of each of the openings, each of the fan modules further comprises another clamp member secured to an opposite side of the fan, said another clamp member comprises an engaging portion having a narrow portion slidably received in said another slot and a wide portion abutting against the outer surface of the corresponding retaining wall.

3. The fan assembly as claimed in claim 1, wherein a flange is bent from a side edge of each retaining wall, an enlarged guiding portion is defined at a junction of the flange and the corresponding retaining wall above each slot, each slot extends from the corresponding enlarged guiding portion in a direction perpendicular to the side edge, and a width of the wide portion of each engaging portion is greater than that of the corresponding slot and smaller than that of the corresponding enlarged guiding portion so that the wide portion is extendable through the enlarged guiding portion to abut against the outer surface of the corresponding retaining wall.

\* \* \* \* \*